United States Patent
Rinzan

(10) Patent No.: US 10,704,150 B2
(45) Date of Patent: Jul. 7, 2020

(54) MONITORING THIN FILM DEPOSITION

(71) Applicant: INFICON, Inc., East Syracuse, NY (US)

(72) Inventor: Mohamed Buhary Rinzan, Manlius, NY (US)

(73) Assignee: INFICON, Inc., East Syracuse, NY (US)

( * ) Notice: Subject to any disclaimer, the term of this patent is extended or adjusted under 35 U.S.C. 154(b) by 105 days.

(21) Appl. No.: 15/026,453

(22) PCT Filed: Oct. 3, 2014

(86) PCT No.: PCT/US2014/059042
§ 371 (c)(1),
(2) Date: Mar. 31, 2016

(87) PCT Pub. No.: WO2015/051250
PCT Pub. Date: Apr. 9, 2015

(65) Prior Publication Data
US 2016/0215397 A1 Jul. 28, 2016

Related U.S. Application Data

(60) Provisional application No. 61/886,333, filed on Oct. 3, 2013.

(51) Int. Cl.
*C23C 16/52* (2006.01)
*C23C 14/54* (2006.01)
(Continued)

(52) U.S. Cl.
CPC ............ *C23C 16/52* (2013.01); *C23C 14/546* (2013.01); *G01B 7/066* (2013.01); *G01R 25/00* (2013.01)

(58) Field of Classification Search
None
See application file for complete search history.

(56) References Cited

U.S. PATENT DOCUMENTS 4,319,204 A * 3/1982 Weldon .................... H03C 1/50
332/113
4,492,915 A * 1/1985 Caspers ................. G01B 15/02
324/637

(Continued)

FOREIGN PATENT DOCUMENTS

| CN | 101166063 A | 4/2008 |
|---|---|---|
| CN | 101826447 A | 9/2010 |

(Continued)

OTHER PUBLICATIONS

International Search Report & Written Opinion, Application No. PCT/US2014/059042, Applicant, INFICON, Inc. dated Jan. 7, 2015, 7 pages.

(Continued)

*Primary Examiner* — Mandy C Louie
(74) *Attorney, Agent, or Firm* — Barclay Damon LLP

(57) ABSTRACT

A system for monitoring thin film deposition is described. The system includes a quartz crystal and a synthesizer to generate a modulated signal. The modulated signal is to be grounded through the quartz crystal. The system also includes a phase detector to determine a phase of the modulated signal from the quartz crystal in order to monitor thin film deposition. A modulation index can be selected so that, at resonance, high frequency of the signal matches the crystal frequency.

7 Claims, 9 Drawing Sheets

(51) Int. Cl.
  *G01B 7/06* (2006.01)
  *G01R 25/00* (2006.01)

(56) References Cited

U.S. PATENT DOCUMENTS

| | | | |
|---|---|---|---|
| 5,112,642 A * | 5/1992 | Wajid | G01L 37/066 |
| | | | 427/10 |
| 5,117,192 A | 5/1992 | Hurd | |
| 2003/0041654 A1 | 3/2003 | Larson, III et al. | |
| 2006/0098206 A1 * | 5/2006 | Kim | G01B 11/0675 |
| | | | 356/495 |
| 2008/0095542 A1 | 4/2008 | Jiang et al. | |
| 2009/0289728 A1 * | 11/2009 | Ben-Aroya | G04F 5/145 |
| | | | 331/94.1 |
| 2010/0227046 A1 | 9/2010 | Kato et al. | |
| 2010/0258529 A1 * | 10/2010 | Mori | H01J 37/32091 |
| | | | 216/67 |
| 2011/0115467 A1 * | 5/2011 | Sato | G01B 7/066 |
| | | | 324/76.49 |
| 2012/0140809 A1 * | 6/2012 | Krause | H04B 17/0037 |
| | | | 375/224 |

FOREIGN PATENT DOCUMENTS

| | | |
|---|---|---|
| JP | 03-285108 A | 12/1991 |
| JP | 04-063676 A | 2/1992 |

OTHER PUBLICATIONS

Chinese Patent Office, Office Action issued in CN Patent Application No. 201480054124.6, dated Oct. 25, 2017 (19 pages).
JP Application No. 2016-519366; filed Oct. 3, 2014; INFICON, Inc.; English translation of Office Action dated Jul. 17, 2018; 10 pages.

* cited by examiner

L=31.2m
Mod. Freq= 5.9729481 MHz

L=51.2m
Mod.Freq= 5.972896 MHz

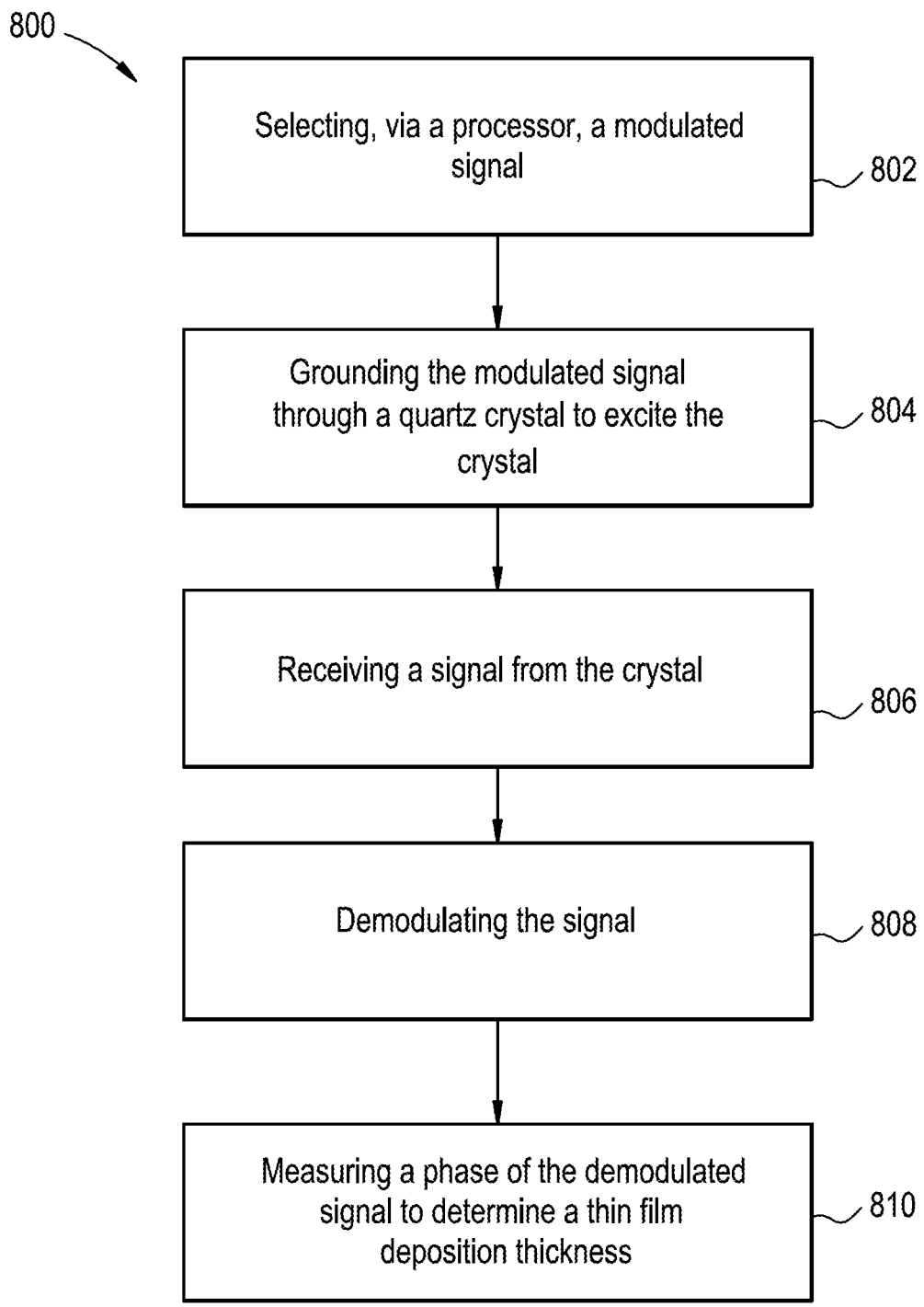

MONITORING THIN FILM DEPOSITION

CROSS-REFERENCE TO RELATED APPLICATIONS

This application claims the benefit of and priority to U.S. Provisional Patent Application Ser. No. 61/886,333, filed Oct. 3, 2013, and entitled "Measurement Of Crystal Resonance," the entirety of which is incorporated herein by reference.

BACKGROUND OF THE INVENTION

Crystal frequency resonance monitoring is commonly used to control deposition rates. However, a cable resonance effect occurs in long coaxial cables in quartz crystal deposition controllers.

A Crystal Interface Unit (XIU) is a crystal resonance monitor based on phase locked loop. XIUs house some parts including the phase sensitive detector portion of the measurement circuit only a short cable length away from a quartz crystal sensor mounted inside a thin film deposition chamber. The XIU is then connected to the rest of the measurement circuit (called a measurement card seated inside a rate control and data processing unit) via a multi-conductor control cable whose length can vary up to 30 m. The design of an XIU includes a capacitance bridge to compensate for the phase shift due to the capacitance of the sensor and the reactive conductance of the cable connecting the XIU to a quartz crystal sensor.

The present configuration provides many benefits including the ability to measure the activity (life) of a monitor crystal that is being coated with different materials. However, such benefits are only available to short cable lengths (up to 4.5 m for most crystals with a starting fundamental frequency of ~6 MHz) and the allowed length further reduces for crystals of higher fundamental frequency. In addition, the maximum length of the sensor cable for an existing XIU also depends on parameters such as cable type, crystal size and geometry, sensor head design, etc.

As the XIU-sensor cable length increases, many of the merits expected of the existing design are lost, primarily due to reflections in coaxial cables, eventually leading to detection failure. Suppressing reflections by impedance matching is a common practice for fixed impedances. The impedance of a quartz crystal, however, varies across a wide range during material deposition. Proper termination in this case (broad frequency band and a wide impedance band) requires multiple matching nodes and a switch circuitry to select the proper matching nodes for crystal impedance falling either side of the specific impedance of the coaxial cable used. Besides the aforementioned issues, long cable lengths also cause increased frequency pulling of crystal resonance and invalid cable compensation track for current XIUs during crystal coating.

Prior schemes experience a reduction in their ability to locate resonance when the electrical length of a XIU-sensor cable (which is a function of both the dielectric constant and the physical length) exceeds a quarter wavelength of the excitation signal. Moreover, a combination of two or more XIUs is required to cover a contiguous length span of up to ~4 m for an RG58 type coaxial cable.

Superconducting cavity stabilized microwave oscillator circuits for thickness rate monitoring of thin film deposition have been demonstrated. See, e.g., the superconducting cavity stabilized microwave oscillator circuit proposed by S. R. Stein and J. P. Turneaure (published in IEEE proceedings, vol. 63, issue 8-1975). FM signals have been converted to AM signals using a cavity.

In some previous devices, the XIU reduces the cable length from the crystal to the controller. The measurement circuit components are in XIU. The maximum cable length is, for example, 4.5 m from crystal to XIU. Beyond that, reflection and phase reversal can occur. However, single flat-panel deposition chambers for Gen 4 and larger glass are too large, 4.5 m is not enough. Longer cable lengths exhibit reflections and standing waves at ¼ λ. ½ λ has the same impedance as 0 m—impedance is periodic with period ½ λ and reverses every ¼ λ.

SUMMARY OF THE INVENTION

A system and method for monitoring thin film deposition are described herein. In an embodiment, a system for monitoring thin film deposition includes a quartz crystal and a synthesizer to generate a modulated signal. The modulated signal is to be grounded through the quartz crystal. The system also includes a phase detector to determine a phase of the modulated signal from the quartz crystal in order to monitor thin film deposition. A modulation index can be selected so that, at resonance, high frequency of the signal matches the crystal frequency.

In another embodiment, a method for monitoring thin film deposition includes selecting, via a processor, a modulated signal. The method also includes grounding the modulated signal through a quartz crystal to excite the crystal. The method further includes receiving a modulated signal from the crystal and demodulating the signal from the crystal. The method additionally includes measuring a phase of the demodulated signal to determine a thin film deposition thickness.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 8 is a flowchart illustrating an example of a method of monitoring thin film deposition.

Figure 1:
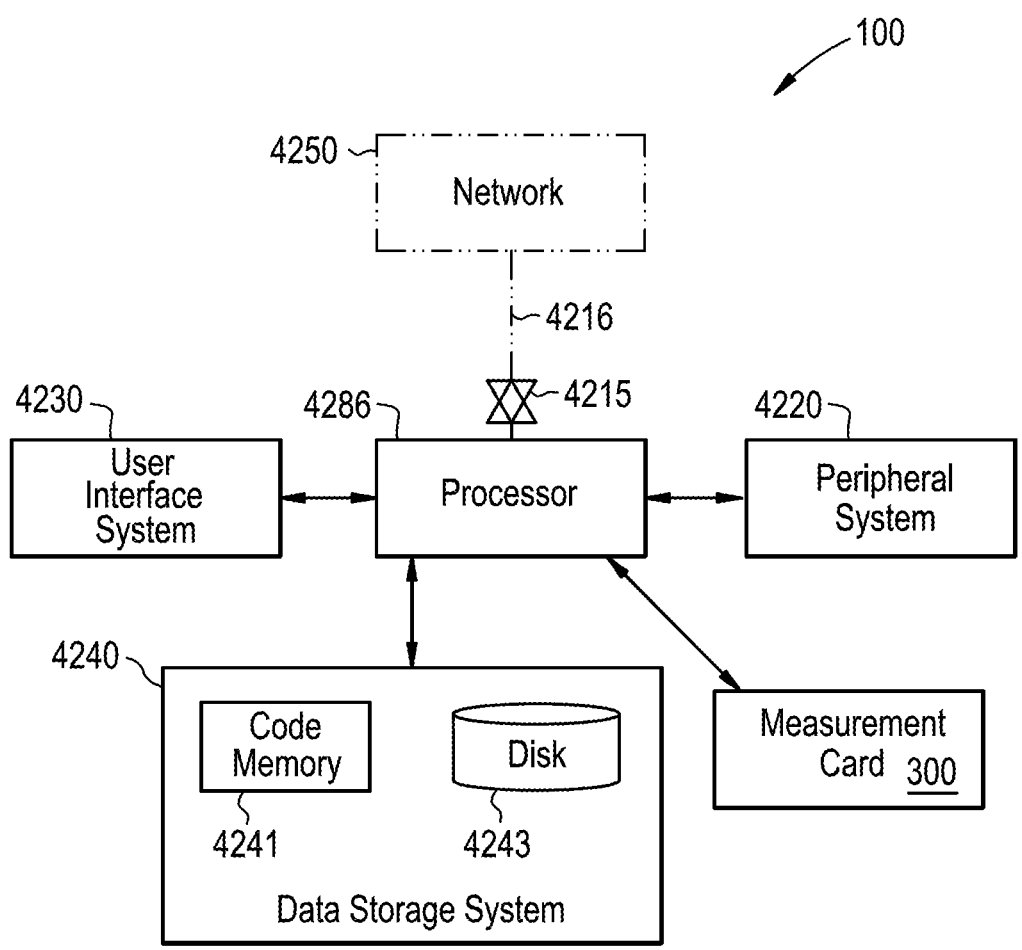
FIG. 1 is a high-level diagram showing the components of a system.

The attached drawings are for purposes of illustration and are not necessarily to scale.

DETAILED DESCRIPTION OF THE INVENTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Using a $\lambda/2$ cable in quartz crystal deposition controllers is not practical because the crystal frequency (thus $\lambda$) changes with use. This crystal frequency change reduces the window of operation. Only certain frequency shift is permissible for a given cable length because phase deteriorates as $\lambda$ changes. Such phase deterioration decreases the frequency stability and resolution of the measurement system.

Impedance and frequency change with deposition, so fixed impedance matching is also not effective. Wide band and wide load impedance matching at the crystal is difficult to achieve with components that can tolerate vacuum. Also, any additional element in vacuum can cause additional line downtime due to failure. It is therefore desirable to measure the crystal resonance frequency in a way that is insensitive to the phase of the crystal excitation (high frequency, e.g., 6 MHz).

Various aspects are directed to overcome reflection limited length of coaxial cables connecting a passive deposition monitor circuit to a remote quartz crystal sensor housed inside a vacuum chamber. Various aspects provide a deposition monitoring circuit substantially immune to problems caused by standing waves in long cables connecting a passive crystal interrogation circuit to a quartz crystal mounted in large deposition systems, which will then include any systems. Various aspects reduce frequency pulling of the impedance spectrum mainly caused by cable capacitance load, especially in the case of long cables. Various aspects are effective with active modes, whether it is fundamental, spurious or overtone, independent of cable length, cable type or sensor head type. Various aspects do not require a varactor-limited bridge circuit for cable compensation. Various aspects have increased frequency bandwidth to cover crystals with fundamental frequency above 6 MHz, limited only by the capability of the device synthesizing the drive waveform. Various aspects can measure the filter quality (Q) of the crystal. This is useful because measurement speed is related to Q. Various crystals permit a measurement speed of 100 ms. Various aspects can measure a crystal without using an interface circuit such as an XIU. Various aspects include a high stability quartz crystal passive resonance circuit for thin film deposition monitoring in a large system. The circuit can be used with existing rate monitors and controllers, e.g., by INFICON.

FIG. 1 is a high-level diagram showing the components of a system. The system 100 is an exemplary data-processing system for analyzing data and performing other analyses described herein, and related components. The system includes a processor 4286, a peripheral system 4220, a user interface system 4230, and a data storage system 4240. The peripheral system 4220, the user interface system 4230 and the data storage system 4240 are communicatively connected to the processor 4286. The processor 4286 can be communicatively connected to a network 4250, such as the Internet or an X.425 network, as discussed below. The processor 4286 can include one or more of systems 4220, 4230, 4240, and can connect to one or more network(s) 4250. The processor 4286, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs).

The processor 4286 can implement processes of various aspects described herein. The processor 4286 can be or include one or more device(s) for automatically operating on data, e.g., a central processing unit (CPU), microcontroller (MCU), desktop computer, laptop computer, mainframe computer, personal digital assistant, digital camera, cellular phone, smartphone, or any other device for processing data, managing data, or handling data, whether implemented with electrical, magnetic, optical, biological components, or otherwise. In an example, the processor 4286 can include Harvard-architecture components, modified-Harvard-architecture components, or Von-Neumann-architecture components.

The phrase "communicatively connected" includes any type of connection, wired or wireless, for communicating data between devices or processors. These devices or processors can be located in physical proximity or not. For example, subsystems such as the peripheral system 4220, user interface system 4230, and data storage system 4240 are shown separately from the data processing system 4286 but can be stored completely or partially within the data processing system 4286.

The peripheral system 4220 can include one or more devices configured to provide digital content records to the processor 4286. For example, the peripheral system 4220 can include digital still cameras, digital video cameras, cellular phones, or other data processors. The processor 4286, upon receipt of digital content records from a device in the peripheral system 4220, can store such digital content records in the data storage system 4240.

The user interface system 4230 can include a mouse, a keyboard, another computer (connected, e.g., via a network or a null-modem cable), or any device or combination of devices from which data is input to the processor 4286. The user interface system 4230 also can include a display device, a processor-accessible memory, or any device or combination of devices to which data is output by the processor 4286. The user interface system 4230 and the data storage system 4240 can share a processor-accessible memory.

In various aspects, the processor 4286 includes or is connected to the communication interface 4215 that is coupled via a network link 4216 (shown in phantom) to the network 4250. For example, the communication interface 4215 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WiFi or GSM. The communication interface 4215 sends and receives electrical, electromagnetic or optical signals that carry digital or analog data streams representing various types of information across the network link 4216 to the network 4250. The network link 4216 can be connected to the network 4250 via a switch, gateway, hub, router, or other networking device.

Processor 4286 can send messages and receive data, including program code, through network 4250, network link 4216 and communication interface 4215. For example, a server can store requested code for an application program (e.g., a JAVA applet) on a tangible non-volatile computer-readable storage medium to which it is connected. The server can retrieve the code from the medium and transmit it through network 4250 to communication interface 4215. The received code can be executed by processor 4286 as it is received, or stored in data storage system 4240 for later execution.

Data storage system 4240 can include or be communicatively connected with one or more processor-accessible memories configured to store information. The memories can be, e.g., within a chassis or as parts of a distributed system. The phrase "processor-accessible memory" is intended to include any data storage device to or from which processor 4286 can transfer data (using appropriate components of peripheral system 4220), whether volatile or non-volatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs). One of the processor-accessible memories in the data storage system 4240 can be a tangible non-transitory computer-readable storage medium, i.e., a non-transitory device or article of manufacture that participates in storing instructions that can be provided to processor 4286 for execution.

In an example, data storage system 4240 includes code memory 4241, e.g., a RAM, and disk 4243, e.g., a tangible computer-readable rotational storage device such as a hard drive. Computer program instructions are read into code memory 4241 from disk 4243. Processor 4286 then executes one or more sequences of the computer program instructions loaded into code memory 4241, as a result performing process steps described herein. In this way, processor 4286 carries out a computer implemented process. For example, steps of methods described herein, blocks of the flowchart illustrations or block diagrams herein, and combinations of those, can be implemented by computer program instructions. E.g., processor 4286 can command the DDS to sweep HF, can record data from the lock-in amp, and can determine a control signal to send to a flat-panel deposition system to adjust the rate according to the measured resonant frequency. Code memory 4241 can also store data, or can store only code.

The system 100 also includes a measurement card 300. The measurement card includes a circuit for monitoring thin film deposition. The circuit can be a passive resonance circuit. The circuit generate a modulated signal which is grounded through a quartz. The signal is modulated such that a length of a cable connecting the measurement card 300 to a deposition chamber does not affect monitoring of the thin film thickness. A signal is received from the quartz and demodulated. The signal is analyzed to determine the thickness of the deposited film.

Figure 2:
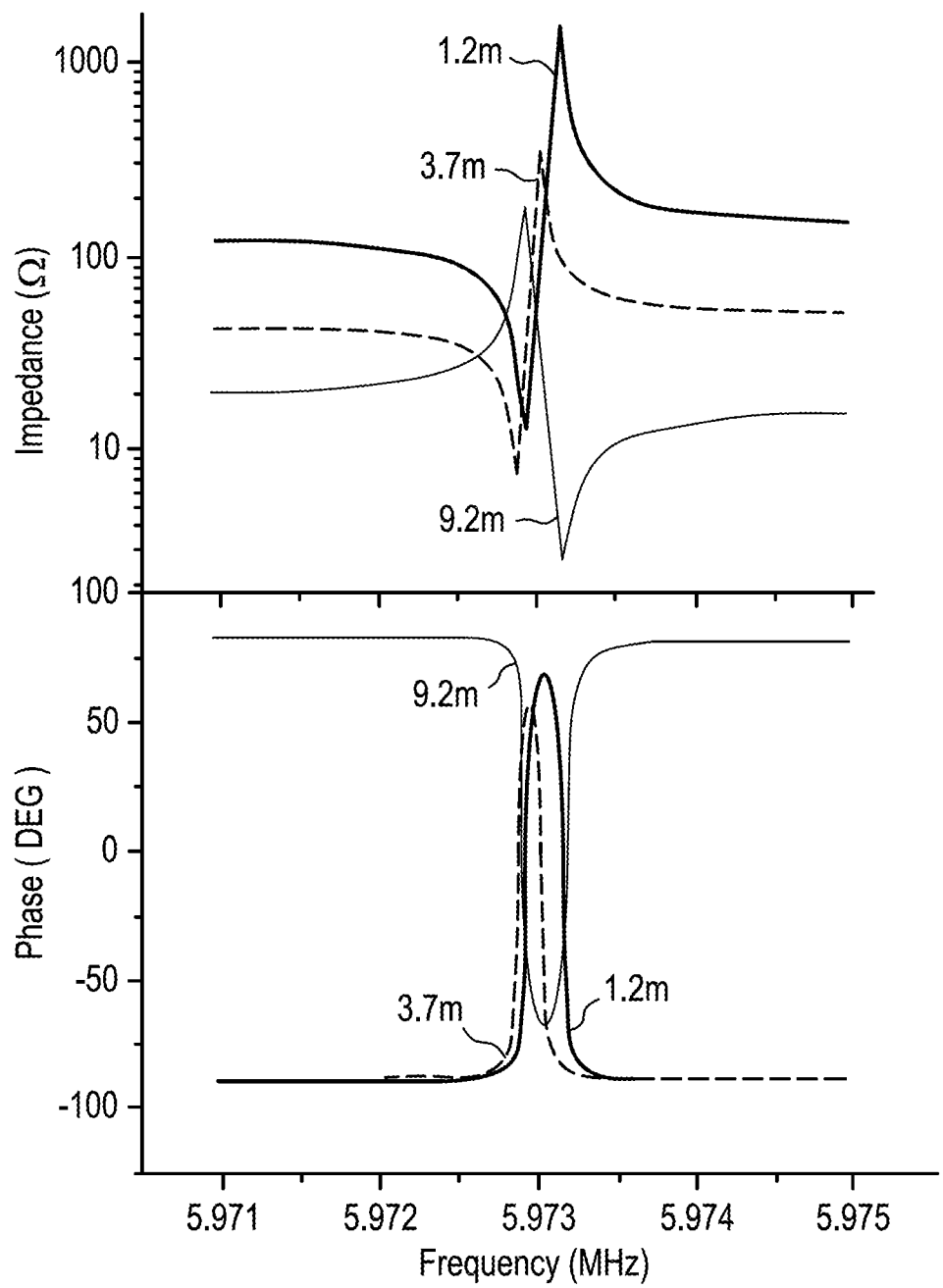
FIG. 2 is an illustration of a problem with long coaxial cables.

FIG. 2 shows a problem with long cables. When the cable length exceeds one-quarter wavelength of the RF impulse, the crystal's impedance spectrum reverses its phase and the operable frequency span decreases with length.

Figure 3:
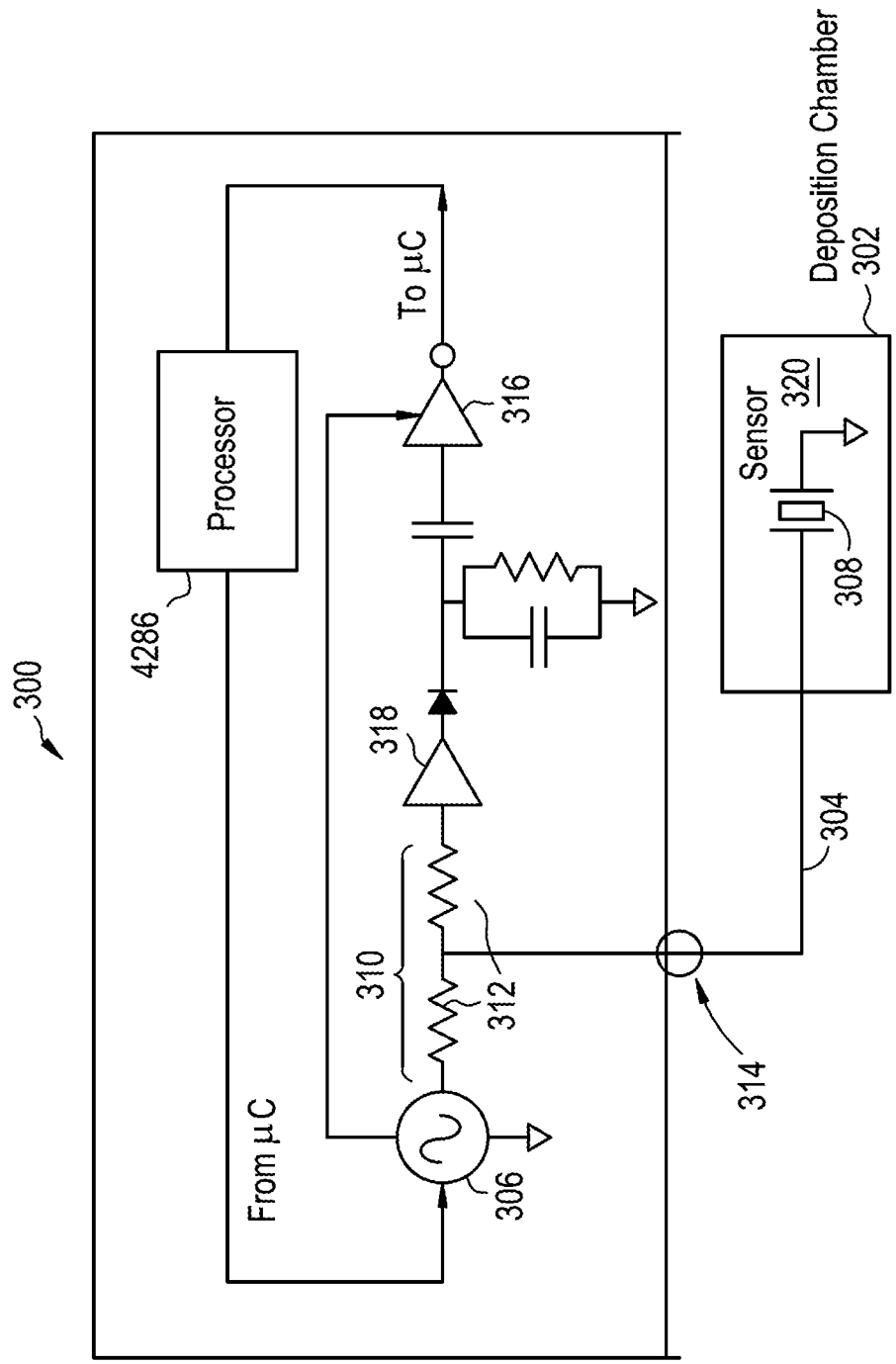
FIG. 3 is a high-level diagram of a measurement card.

FIG. 3 is a high-level diagram of a measurement card. A long cable 304 connecting the measurement card 300 and the deposition chamber 302 is shown by the heavy black line. Detection of the fundamental resonance of a crystal has been tested successfully using a rudimentary circuit and general electronic lab equipment such as a function generator, a phase detector 316, and a voltmeter (or an oscilloscope). The processor 4286 can close a control loop to measure crystal resonance and, e.g., control deposition rate. Processor 4286 can also control the frequencies generated by the synthesizer 306, such as a DDS. Acronyms include:

| | |
|---|---|
| PM | Phase modulation |
| FM | Frequency modulation |
| AM | Amplitude modulation |
| DDS | Direct Digital synthesizer |
| PM or FM | Phase modulated or Frequency modulated |
| DDS | Direct Digital synthesized signal |

A synthesizer 306 (e.g., a direct digital synthesizer) generates a frequency- or phase-modulated signal. That signal is grounded through a quartz crystal 308 in the deposition chamber 302. The crystal 308 has a conductance that varies with frequency. At the resonance frequency of the crystal, conductance reaches its peak. Since high conductance (low impedance) is used, it doesn't matter how long the cable 304 is as long as the cable 304 has low enough impedance at the measurement frequencies that cable impedance doesn't swamp the impedance change of the crystal. In other words, the minimum reflection at resonance converts the FM to AM.

FM or PM modulation can be implemented directly with a synthesizer 306 (see, e.g., Analog Device application note AN-543-High Quality, All-Digital RF Frequency Modulation Generation with the ADSP-2181 DSP and the AD9850 Direct Digital Synthesizer), such as a DDS or other frequency synthesizer or waveform generator. A low frequency is approximately in the range 1-1000 Hz sinusoidal. A high frequency is approximately in the range 4-7 MHz sinusoidal.

A phase detector 316 is to receive a signal from the quartz 308. The phase detector 316 can be any suitable phase detector, such as a lock-in amplifier. The phase detector 316 is to determine a phase of a signal from the crystal 308 in order to determine a thickness of a thin film.

The T-Network 310 can include a resistor 312 on each arm, as shown, or a resistor in series with a capacitor on each arm to block DC. The T-network 310 can also include an LCR series circuit shunted by a static parallel capacitor representing the quartz crystal as in Butterworth van dyke model. In an example, ground is as same as the BNC shield 314 and tied to the measurement card ground and the body of the metal deposition chamber.

This and other circuits described herein can be used as thin film thickness rate monitoring circuits. As thin-film material is deposited on the surface of the crystal, its resonant frequency changes. The change in frequency can be measured and used to determine the amount of mass on the crystal. Repeated measurements over time permit determining deposition rate.

Figure 4:
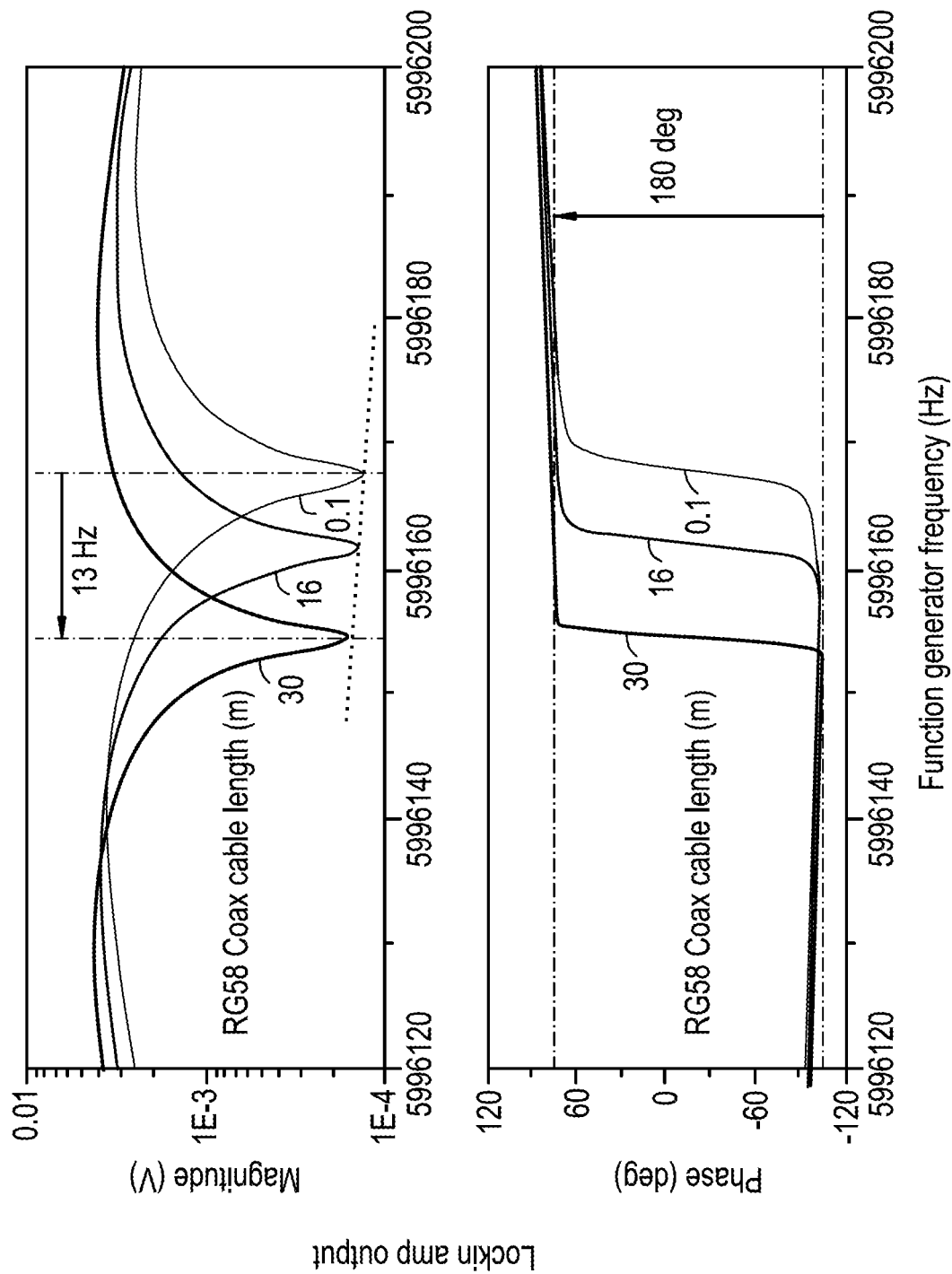
FIG. 4 shows magnitude and phase measurements from a lock-in amp.

FIG. 4 shows magnitude (correlated to impedance) and phase measurements from the lock-in amplifier as the high frequency is swept. A wide range sweep did not show any peaks due to cable resonances. A frequency pulling of only 13 Hz was noted going from 0.1 to 30 m of cable length, which is much reduced compared to prior devices. The absence of the bulky controller cable and the simplistic nature of the circuit can result in reduced cost.

Figure 5A:
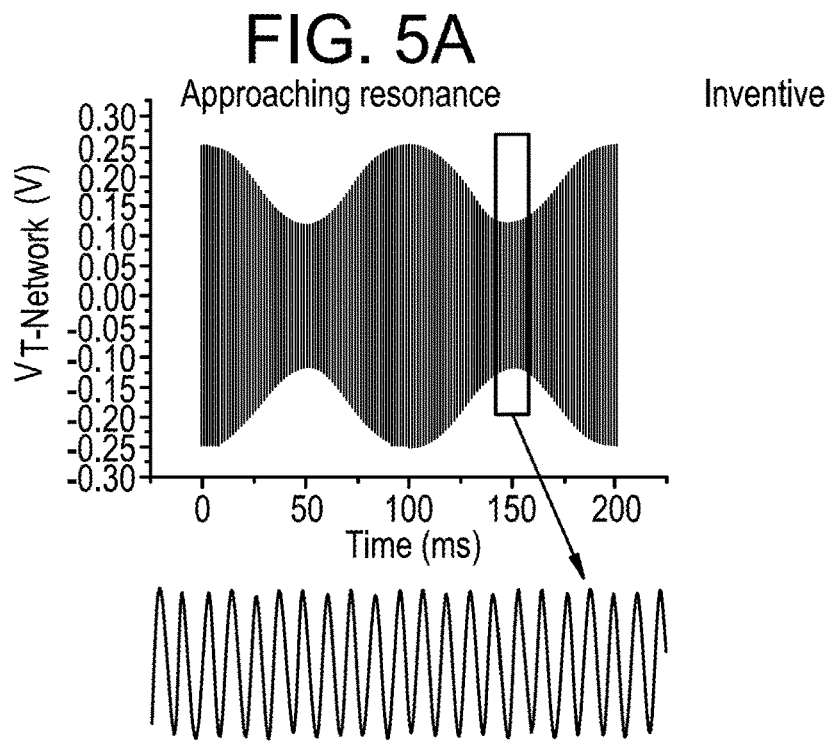
FIGS. 5a-5b show an exemplary transformed phase modulated signal.
Figure 5B:
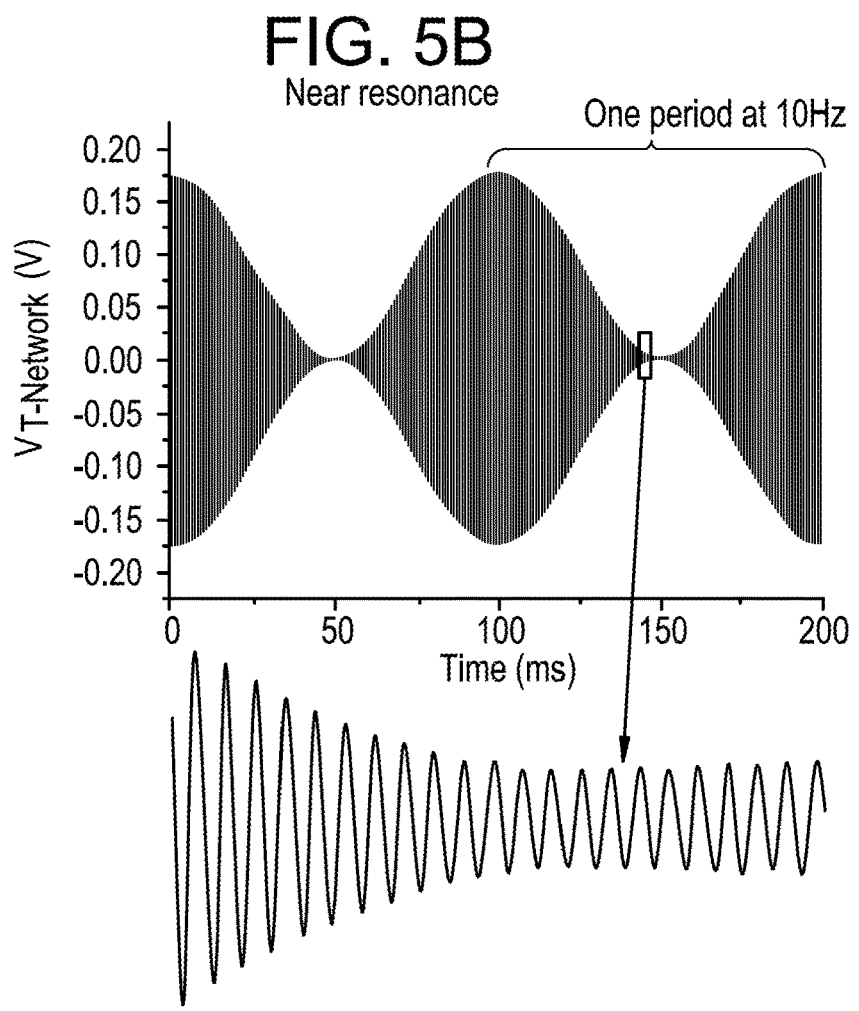

FIGS. 5a-5b show an exemplary transformed phase modulated signal. The exemplary phase modulated signal is transformed to an amplitude modulated signal by the monitor crystal. The diode and the filter form the demodulation of AM (as is conventionally done) to produce a signal similar to the frequency of the carrier. The phase of the signal is in sync with that of the carrier when the modulation frequency of the DDS signal matches the crystal's resonance frequency and the frequency of the carrier signal is within the FM/PM modulation bandwidth. In this example, the low frequency is 10 Hz and the high frequency is ~5.97 MHz. (5.972960 MHz on the top, i.e., 10 Hz off resonance, and 5.972950 MHz on the top, i.e., at resonance).

The crystal is a shunt for every frequency except those absorbed due to resonance. Using sinusoidal signals, a PM sinusoid is a sum of Bessel functions. One component corresponds to the crystal frequency. When the crystal absorbs that component, there is a Bessel function missing from the sum. The resulting signal is thus amplitude modulated (the crystal has absorbed a component at the resonance frequency). Crystal absorption is not phase-dependent; however long the cable is, the crystal will absorb that component. A cable with a velocity factor of 0.66 can be used, giving λ, approx. 32 m for 6 MHz example.

The T network acts as a directional coupler. The crystal draws current at the resonance frequency, so the signal into the demodulator is amplitude modulated. Demodulation gives the envelope of the signal. The phase of the envelope is in phase with the low frequency (LF, e.g., from the Textronix described below) signal when the crystal is at resonance. Thus, the high frequency is swept (HF, e.g., from the SRS described below) and the envelope phase is monitored. The zero-crossing of the envelope phase indicates the resonance frequency, as discussed below. (Longer cables used with prior devices may not see a zero crossing of phase.) Even if reflections obscure HF phase information, the demodulated envelope still has a clean zero crossing.

Unlike prior schemes, in various aspects, the modulation index is selected so that at resonance, the high frequency matches the crystal frequency. In a counterexample, when the modulation voltage is high, the resonance condition can happen away from the natural frequency of the crystal. For example, in overmodulation, when crystal is in resonance, AM signal is not 100% modulated—is slightly overmodulated. However, for properly adjusted modulation conditions, detected resonance freq. is close to the crystal's natural frequency (with deposition—independent variations). In other conditions, detection is e.g. 400 Hz away. As frequency moves away from resonance, the signal is reduced and there is less ability to detect deposition. Accordingly, modulation conditions are selected (e.g., experimentally) to provide desired results.

Figure 6:
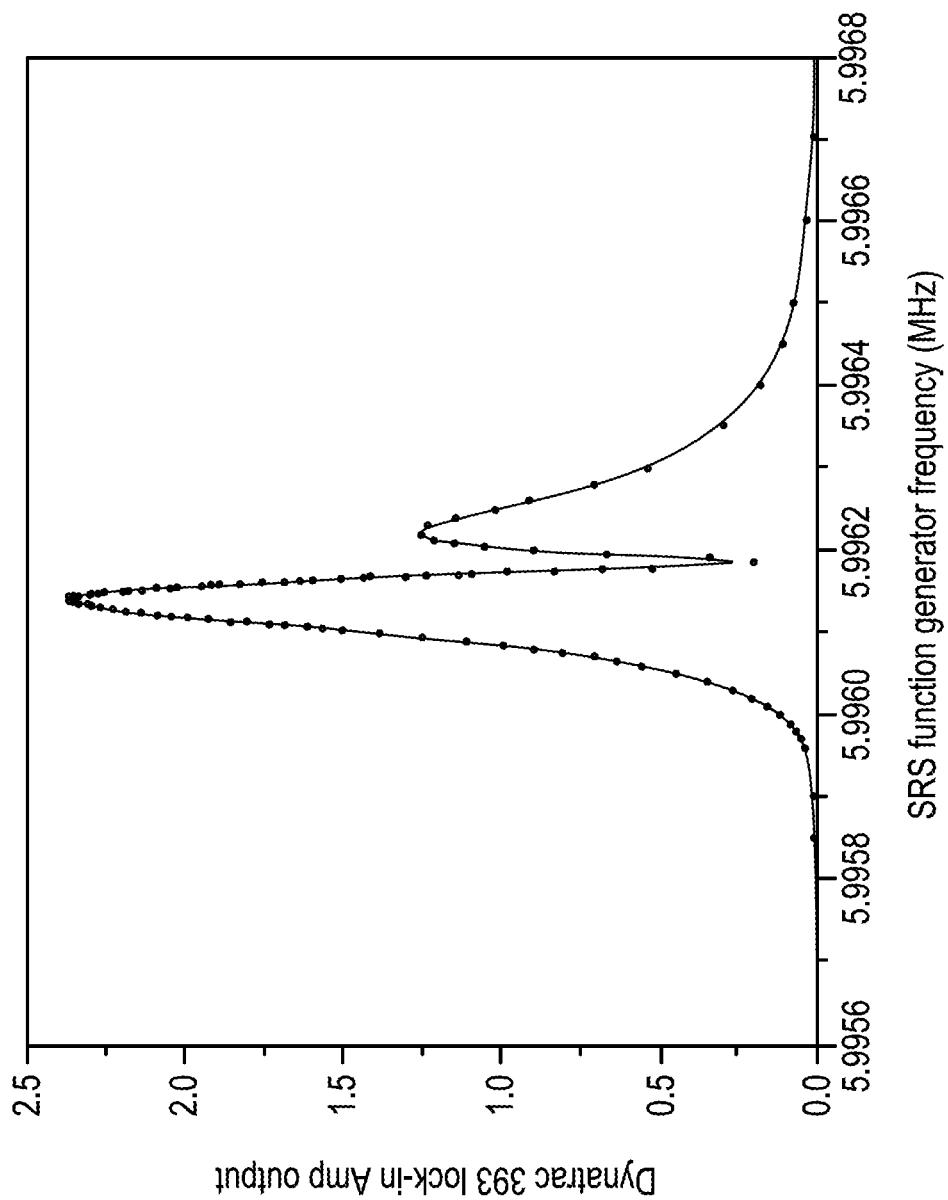
FIG. 6 shows an admittance curve of a canned crystal obtained with the present measurement system.
Figure 7A:
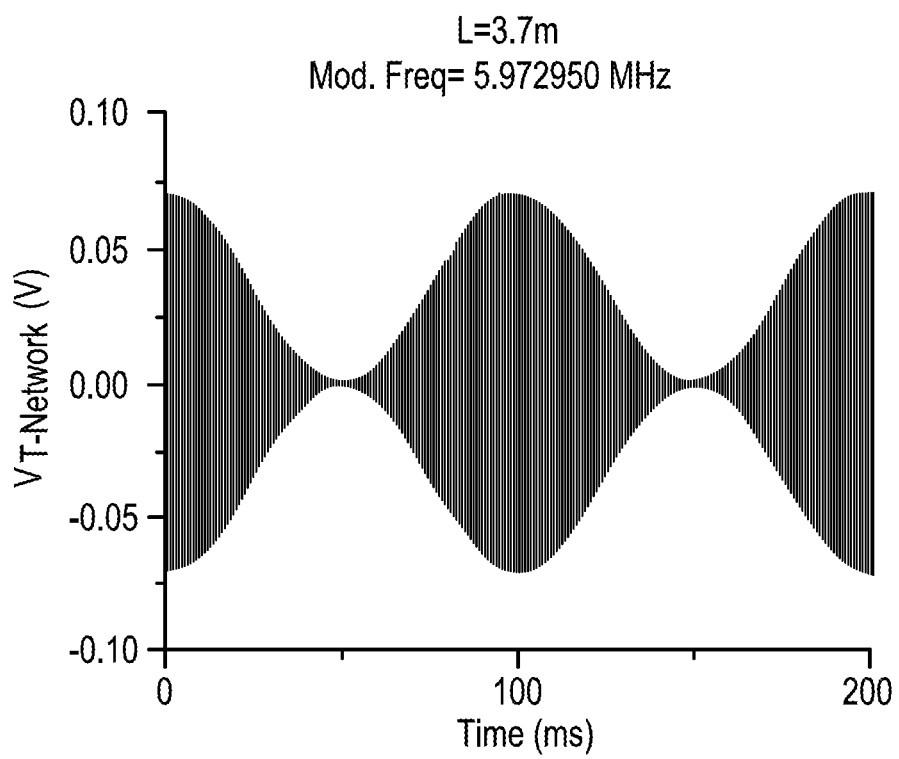
FIGS. 7A-7D show experimental data.
Figure 7B:
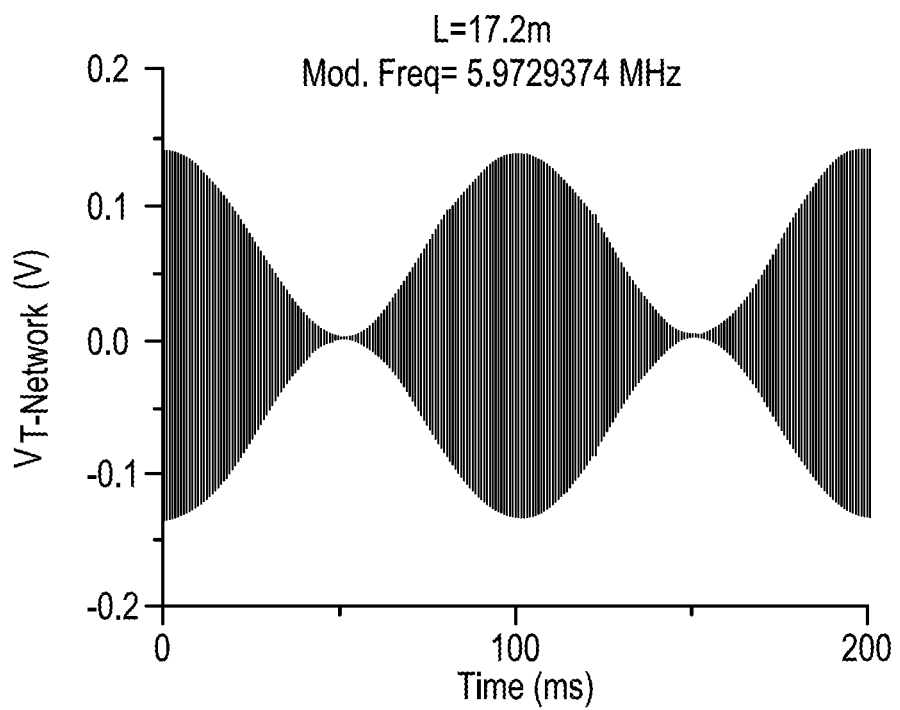
Figure 7C:
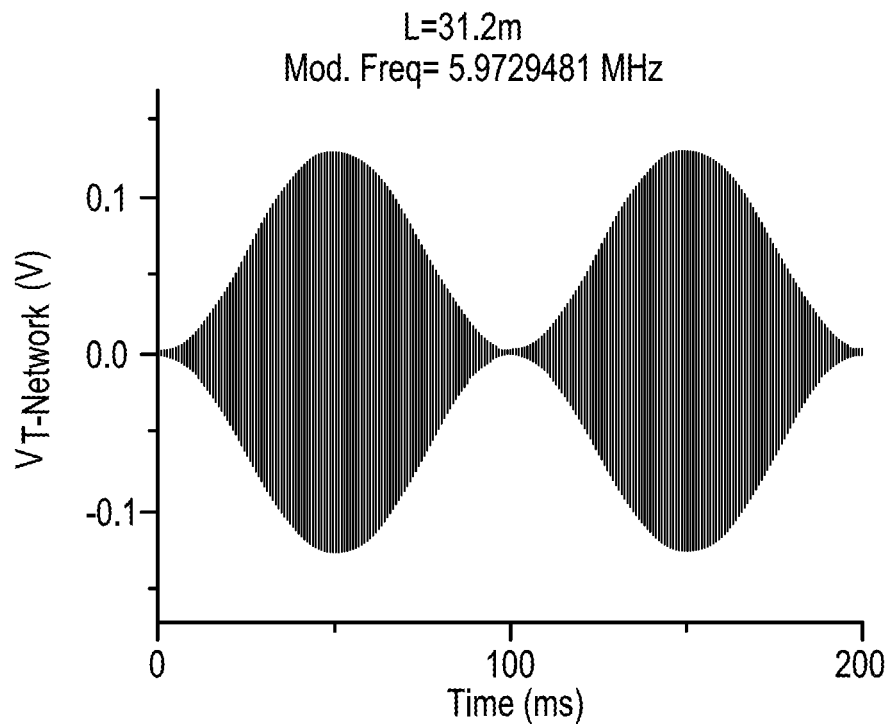
Figure 7D:
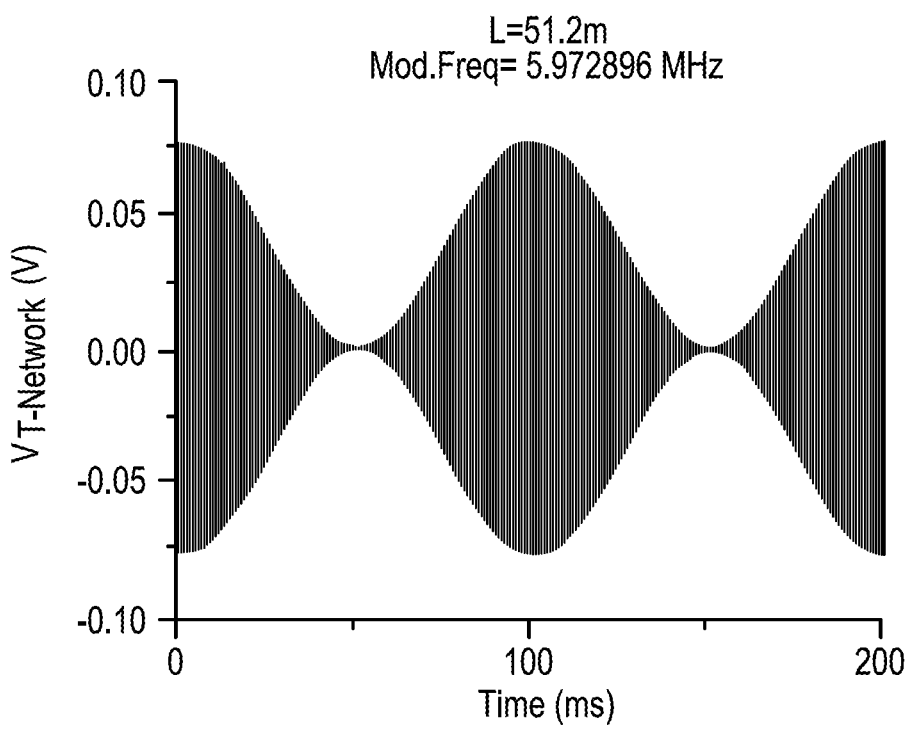

FIG. 6 shows the admittance curve of a canned crystal (fundamental resonance at 5.996913 MHz) obtained with the proposed circuit showing the resonance of the crystal. The length of the cable used was 36.75 m. The second graph obtained using phase modulation and SR850 DSP Lock-in amplifier shows the cable pulling of the resonance frequency when the length was changed from 0.1 m to 30 m.

An experiment was performed. FIGS. 7A-7D show the results of this experiment. Phase vs. frequency and amplitude vs. frequency curves were obtained by using a prototype (circuit components laid out on a breadboard) and connecting a Textronix function generator as the low-frequency source (e.g., 10-100 Hz), an SRS function generator as the high-frequency source (e.g., 5-7 MHz) and a Dynatrac or SRS Lock-in amplifier to monitor the output.

Phase modulation of the high-frequency signal was obtained by connecting the Textronix generator to the external modulation input of the SRS. RF amplitude, Modulation amplitude, RF shape, Mod shape and Mod Frequency were kept constant. Using a LabVIEW program and a National Instrument GPM-USB cable, the frequency of the SRS output was changed (high-frequency sweep) and the Lock-In outputs (amplitude and phase) were queried and written to a file. The frequency was changed from below resonance to above resonance.

The low frequency is selected according to the crystal quality Q. Q depends on the type of piezoelectric material used, quality of the cultured crystal, processing of the blanks and many other things. Q is inversely proportional to full width at half maximum of amplitude (FWHM) of the admittance peak of crystal resonance. The modulation bandwidth (which relates to the speed of measurement and to the low frequency) needs to be less than FWHM of crystal. In other words, high Q crystal decreases the measurement speed.

The low frequency can be selected based on bandwidth (BW). BW of PM should be less than the full-width at half maximum (FWHM) of admittance peak of crystal resonance. Characterize per crystal type. Q was measured using network analyzer at different states of coating to determine FWHM. BW=2*(low frequency)*(1+Modulation Index). For example, for a mod index of 1, low freq of 10 Hz, BW=40 Hz. Higher-Q crystals require lower low frequencies (Textronix). Therefore measurements are slower because it takes longer to determine the phase of the lower-frequency signal.

The measured magnitudes during the HF sweep can be used to derive the Q of the crystal. The detected signal strength can be used to derive the reflection coefficient and the quality of the crystal.

FIG. 8 is a flowchart illustrating an example of a method of monitoring thin film deposition. Various steps of the method can be performed in any order except when otherwise specified, or when data from an earlier step is used in a later step. The method can be carried out by a system, such as the system described above with relation to FIG. 1.

At block 802, a modulated signal can be selected via a processor. The modulated signal can be a phase modulated signal or a frequency modulated signal. At block 804, the modulated signal is grounded through a quartz crystal to excite the crystal. At block 806, a signal is received from the crystal. At block 808, the signal is demodulated. At block 810, the phase of the demodulated signal is measured to determine a thin film deposition thickness.

Example 1

A system for monitoring thin film deposition is described herein. The system includes a quartz crystal and a synthesizer to generate a modulated signal, the modulated signal to be grounded through the quartz crystal. The system further includes a phase detector to determine a phase of the modulated signal from the quartz crystal in order to determine a thin film thickness.

The modulated signal can be a frequency modulated signal. The modulated signal can be a phase-modulated signal. A modulation index can be selected such that, at resonance, a frequency of the signal matches a crystal frequency. A frequency of the signal can be selected such that crystal conductance reaches a peak. The system can further include a cable to couple the system to a deposition chamber, wherein a length of the cable does not decrease thin film deposition detection. A change in frequency of the crystal is to change as a thin film is deposited on a surface of the quartz crystal and the change in frequency is to be monitored to detect thin film deposition.

Example 2

A method for monitoring thin film deposition is described herein. The method includes selecting, via a processor, a modulated signal. The method also includes grounding the modulated signal through a quartz crystal to excite the crystal. The method further includes receiving a modulated signal from the crystal and demodulating the signal from the crystal. The method additionally includes measuring a phase of the demodulated signal to determine a thin film deposition thickness.

The modulated signal can be a frequency modulated signal. The modulated signal can be a phase-modulated signal. The modulated signal can be selected such that, at resonance, frequency of the modulated signal matches frequency of the quartz crystal. A cable can connect a thin film monitoring system to a deposition chamber and the modulated signal can be selected such that length of the cable does not affect thin film thickness detection. The modulated signal can be selected such that crystal conductance reaches a peak. The method can further include determining a change in frequency of the demodulated signal to monitor thin film deposition.

Exemplary method(s) described herein are not limited to being carried out by components specifically identified herein.

In view of the foregoing, various aspects provide measurement of crystal resonance frequencies. A technical effect is to excite the crystal with a drive signal and measure the effect of the crystal on that signal.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein may be embodied as computer program products including computer readable program code stored on a tangible non-transitory computer readable medium. Such a medium can be manufactured as is conventional for such articles, e.g., by pressing a CD-ROM. The program code includes computer program instructions that can be loaded into processor 4286 (and possibly also other processors), to cause functions, acts, or operational steps of various aspects herein to be performed by the processor 4286 (or other processor). Computer program code for carrying out operations for various aspects described herein may be written in any combination of one or more programming language(s), and can be loaded from disk 4243 into code memory 4241 for execution. The program code may execute, e.g., entirely on processor 4286, partly on processor 4286 and partly on a remote computer connected to network 4250, or entirely on the remote computer.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

What is claimed is:

1. A method for monitoring thin film deposition in a deposition chamber, comprising:
    generating, by the synthesizer, a modulated signal using a low frequency signal selected in the range of 1 Hz to 1000 Hz and a high frequency signal, the high frequency signal being swept through the range of 4 MHz to 7 MHz;
    grounding the quartz crystal located in the deposition chamber;
    producing an amplitude modulated signal by the quartz crystal drawing current from a component of the modulated signal generated by the synthesizer;
    demodulating the amplitude modulated signal producing an envelope of the amplitude modulated signal; and
    measuring a phase of the envelope, during the generating of the modulated signal including the high frequency signal being swept, to determine a thin film deposition thickness, wherein the phase of the envelope being equal to the phase of the low frequency signal of the modulated signal when the high frequency signal is swept through a specific frequency in the range indicates that the quartz crystal is in resonance at the high frequency signal with the specific frequency given the thin film deposition thickness.

2. The method of claim 1, wherein the modulated signal generated by the synthesizer is a frequency modulated signal.

3. The method of claim 1, wherein the modulated signal generated by the synthesizer is a phase-modulated signal.

4. The method of claim 1, wherein the high frequency signal of the modulated signal generated by the synthesizer is selected to match a resonance frequency of the quartz crystal given the thin film deposition thickness.

5. The method of claim 1, wherein a cable connects, in a T-network, the quartz crystal located in the deposition chamber, the synthesizer and a demodulator for demodulating the amplitude modulated signal, and wherein the high frequency signal of the modulated signal generated by the synthesizer is selected such that a length of the cable does not affect thin film deposition thickness detection.

6. The method of claim 1, wherein the modulated signal generated by the synthesizer is selected such that conductance of the quartz crystal reaches a peak.

7. The method of claim 1, further comprising changing the high frequency signal of the modulated signal to monitor the thin film deposition thickness.

\* \* \* \* \*